United States Patent [19]
Fürter

[11] Patent Number: 5,880,891
[45] Date of Patent: Mar. 9, 1999

[54] HIGH-RESOLUTION HIGH-APERTURED OBJECTIVE

[75] Inventor: Gerd Fürter, Ellwangen, Germany

[73] Assignee: Carl-Zeiss-Stiftung, Heidenheim, Germany

[21] Appl. No.: 845,384

[22] Filed: Apr. 25, 1997

[30] Foreign Application Priority Data

Apr. 27, 1996 [DE] Germany ................. 196 16 922.4

[51] Int. Cl.[6] .................. G02B 3/00; G02B 21/02; G02B 17/00; G02B 27/12
[52] U.S. Cl. .................. 359/651; 359/661; 359/726; 359/639
[58] Field of Search .................. 359/727, 732, 359/494, 495, 487, 488, 497, 728, 651, 661, 656, 726, 364, 639

[56] References Cited

U.S. PATENT DOCUMENTS

| | | | |
|---|---|---|---|
| 5,212,593 | 5/1993 | Williamson et al. | 359/487 |
| 5,251,070 | 10/1993 | Hashimoto et al. | 359/732 |
| 5,402,226 | 3/1995 | Matthews et al. | 359/727 |
| 5,402,267 | 3/1995 | Fürter et al. | 356/141.3 |

FOREIGN PATENT DOCUMENTS

| | | |
|---|---|---|
| 0350955 | 1/1990 | European Pat. Off. . |
| 0465882 | 1/1992 | European Pat. Off. . |
| 0608572 | 8/1994 | European Pat. Off. . |
| 4110296 | 10/1991 | Germany . |
| 4203464 | 8/1992 | Germany . |

OTHER PUBLICATIONS

"New Approach to Resolution Limit and Advanced Image Formation Techniques in Optical Lithography", H. Fukuda, A. Imai, T. Terasawa and S. Okazaki, IEEE Transaction on Electron Devices, vol. 38, No. 1, Jan. 1991, pp. 67–75.

*Primary Examiner*—Georgia Epps
*Assistant Examiner*—Evelyn A. Lester
*Attorney, Agent, or Firm*—Walter Ottesen

[57] ABSTRACT

The invention is directed to a high-resolution high-apertured objective which includes an object plane (1); a first lens group (LG1); a second lens group (LG2) downstream of the first lens group; a beamsplitter (17, 18, 22, P) downstream of the second lens group; a concave mirror (21); a system diaphragm (A) interposed between the beamsplitter and the concave mirror; a third lens group (LG3); the objective defining an image plane and being configured to provide a reduction scale ($\beta$) in the range of −0.4 to −0.15 and an image side numerical aperture greater than 0.5. The first and second lens groups (LG1, LG2) are configured to conjointly reduce the sine of the marginal ray angle. The reduction can be up to 40%. Preferably, the second lens group (LG2) can be configured to alone reduce the sine of the marginal ray angle. It is preferable that the sine of the marginal ray angle ($\sin R_{LG1}$) after the first lens group (LG1) is not less than the sine of the marginal ray angle ($\sin R_{reticle}$) in the object plane.

14 Claims, 2 Drawing Sheets

HIGH-RESOLUTION HIGH-APERTURED OBJECTIVE

FIELD OF THE INVENTION

The invention relates to a high-resolution high-apertured objective. The objective is configured as a catadioptric reduction objective having lens groups, a beamsplitter and a concave mirror.

BACKGROUND OF THE INVENTION

Objectives of this kind are known as projection objectives for use in microlithography wherein the radiation lies in the deep ultraviolet range (wavelengths of 248 nm, 193 nm and others). An example of such a projection objective is presented in U.S. Pat. No. 5,402,226 and in U.S. patent application Ser. No. 08/583,025, filed Jan. 19, 1996, both of which are incorporated herein by reference.

European patent publication 0,465,882 (corresponding to U.S. patent application Ser. No. 07/551,116, filed Jul. 11, 1990) also discloses a high resolution reduction catadioptric lens.

U.S. Pat. No. 5,251,070 shows a catadioptric reduction projection optical system in FIG. 4 thereof wherein the numerical aperture is 0.4 so that the requirements on this objective are overall relaxed. The angle of the marginal ray increases from the object (that is, from the reticle) to the beamsplitter and mirror.

U.S. Pat. No. 5,402,226 provides a significantly reducing imaging scale of the concave mirror, that is, less than 0.3 (in the embodiment shown, the imaging scale is less than 0.14) for the case where the objective provides a reduction by a factor of 4. In the embodiment of FIG. 2 or FIG. 3 and in Table 2, the sine of the marginal ray angle at the reticle is 0.145 with a numerical aperture of 0.58. After the first lens group and at a possible location for the folding mirror, the numerical aperture is approximately 0.13 and, after the second lens group (that is, at the input of the beamsplitter), the numerical aperture is 0.060.

European patent publication 0,608,572 (corresponds to U.S. patent application Ser. No. 08/009,284, filed Jan. 26, 1993, and 08/134,505, filed Oct. 8, 1993) discloses a catadioptric optical reduction system. In this publication, the lens group lying forward of the beamsplitter cube and the lens group lying forward of the concave mirror both have "negative power". Accordingly, the local numerical aperture (which is the same as the sine of the angle of the marginal ray) is increased. The forward-mounted lens groups are so configured that they image the entry pupil from infinity into the system diaphragm at the concave mirror. With this measure, the beam cross section at the beamsplitter input can, inter alia, be held low. In this way, one obtains an advantageously small beamsplitter cube even for a high numerical aperture (0.7) of the objective.

SUMMARY OF THE INVENTION

It is an object of the invention to provide a catadioptric reduction objective wherein the marginal ray angle and the beam diameter are especially advantageous at the input to the beamsplitter. The marginal ray angle and the beam diameter are dependent upon each other. On the one hand, a small beam diameter makes a small beamsplitter possible whereby a high numerical aperture is achieved. First, the space for accommodating lenses is not significantly affected by the beamsplitter (see U.S. Pat. No. 5,402,267) and, in addition, the manufacture of a disturbance-free beamsplitter is significantly facilitated with the reduced dimensions.

On the other hand, the divergence angle remains limited and this is a significant convenience for the manufacture of a high quality polarizing beamsplitter made of dielectric layers.

At the same time, excellent color correction is obtained without utilizing different lens materials.

The invention is for a high-resolution high-apertured objective which includes: an object plane; a first lens group; a second lens group downstream of the first lens group; a beamsplitter downstream of the second lens group; a concave mirror; a system diaphragm interposed between the beamsplitter and the concave mirror; a third lens group; the objective defining an image plane and being configured to provide a reduction scale ($\beta$) in the range of −0.4 to −0.15 and an image side numerical aperture greater than 0.5; and, the first and second lens groups being configured to conjointly reduce the sine of the marginal ray angle.

Imaging the entry pupil, which lies at infinity, onto the system diaphragm in the region of the concave mirror is made somewhat difficult but is nonetheless possible.

At the same time, the beamsplitter can be kept small but not as small as in European patent publication 0,608,572 but the beamsplitter can nonetheless be held to a size which is adequate. The beamsplitter has an approximately cube-like shape and is put together from two prisms. This applies especially for the application of the objective in a wafer scanner wherein the image is a narrow slit.

If the marginal ray angle forward of the beamsplitter is reduced overall, then the elevations of the marginal ray are greater especially in close proximity to the beamsplitter than if the angle of the marginal ray is increased. Furthermore, the refractive powers are greater close to the beamsplitter. This applies especially when the second lens group is a collecting lens group, that is, a lens group which operates to reduce the marginal ray angle. In this way, the product of marginal ray elevation and refractive force is increased in the region forward of the beamsplitter. The corrective action on the chromatic magnification difference is however proportional to this product. With this embodiment of the invention, excellent color correction is achieved independently of whether achromatization is provided via two different lens materials.

If reduction exceeds 30% and approaches 40%, then although the color correction improves further, the beamsplitter however becomes still larger so that a numerical aperture of the objective of 0.7 becomes very difficult and a numerical aperture of 0.6 with good quality can be achieved more easily.

According to a feature of the invention, the second lens group reduces the sine of the marginal ray angle by up to 40%. It is customary that the second lens group is separated from the first lens group by a free space which is suitable for mounting a deflecting mirror. The above-described color-correction action is primarily effected by the second lens group.

According to another feature of the invention, the first lens group should not reduce the angle of the marginal ray which is in contrast to the disclosure of European patent publication 0,608,572. In the embodiment of the invention, an increase should rather be provided because then the described color-correcting action of the second lens group becomes still greater. Imaging the entry pupil lying at infinity on the system diaphragm in the region of the concave mirror is not affected thereby.

The fewer optical elements which are present between the beamsplitter and the concave mirror, the higher the numerical aperture can be made. Especially disturbing are free-standing lenses. For this reason, and according to another feature of the invention, no free-standing lenses are mounted between the beamsplitter and the concave mirror. A plane-parallel plate (plate 19/20 in FIG. 1 of the drawings herein) is however unavoidable if the λ/4-plate cannot be configured as a thin layer packet on the exit face 18 of the beamsplitter.

According to another feature of the invention, the objective can be built up from only seven lenses in the first two lens groups which is comparatively cost effective.

In another feature of the invention, the beamsplitter is first utilized in reflection. In this way, for this critical contact (in comparison to transmission), the low divergence of the rays in advance of the action of the concave mirror is utilized.

Another embodiment of the invention is directed to a complete microlithographic projection illumination system including a projection objective of the kind described above. This system is designed for deep ultraviolet (wavelengths less than 250 nm) and is especially provided for an excimer laser having a light source emanating radiation at 193 nm wavelength. In this wavelength range, known refractive objectives require spectrally very narrow bandwidth lasers.

BRIEF DESCRIPTION OF THE DRAWINGS

The invention will now be described with reference to the drawings where.

DESCRIPTION OF THE PREFERRED EMBODIMENTS OF THE INVENTION

Figure 1:
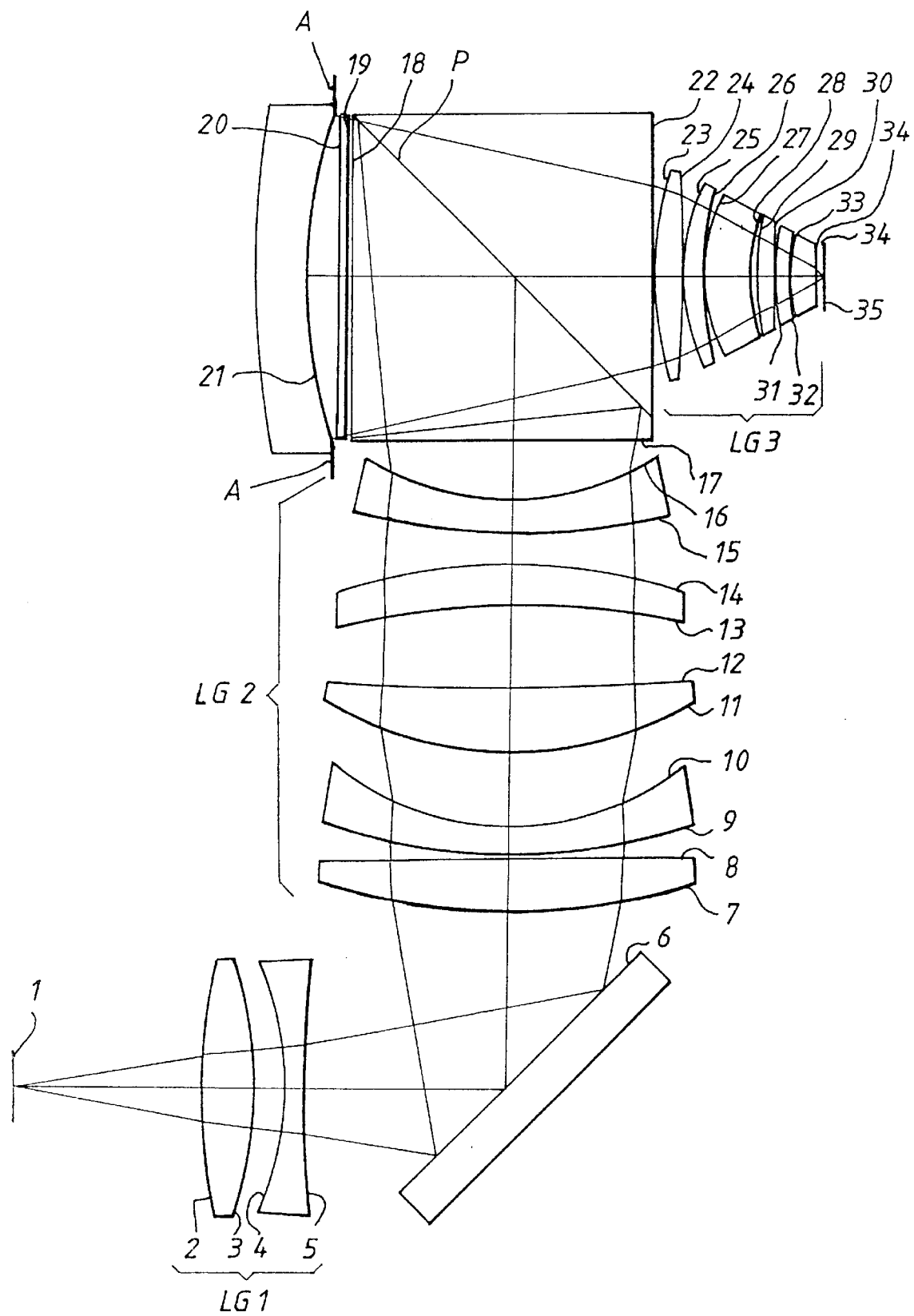
FIG. 1 is a schematic of an embodiment of the catadioptric reduction objective according to the invention; and, FIG. 2 is a schematic showing a microlithographic projection illumination system incorporating the objective of FIG. 1.

Table 1 presents the lens data for the catadioptric reduction objective shown in FIG. 1 and Table 2 compares several important sines of the marginal ray angle and imaging scales of the embodiment of FIG. 1 to the examples shown in U.S. Pat. No. 5,402,226 and European patent publication 0,608,572.

The concave mirror 21 is aspherical in accordance with the conventional equation:

$$z = \left\{ 1: \left( r + r \cdot \sqrt{(1 - h^2/r^2)} \right) \right\}.$$

$$h^2 + A_4 h^4 + A_6 h^6 + A_8 h^8 + A_{10} h^{10} + A_{12} h^{12}$$

wherein: r=vertex radius, h=elevation to the optical axis; and, with the following aspherical constants:

$A_4 = 0.175861 \cdot 10^{-9}$
$A_6 0.267922 \quad 10^{-13}$
$A_8 = 0.174598 \cdot 10^{-17}$
$A_{10} = -0.606697 \cdot 10^{-22}$
$A_{12} = +0.769485 \cdot 10^{-26}$ The image end numerical aperture is 0.70, the image field is adapted to a wafer scanner and is 26×7 mm². The imaging scale is β=−0.25.

The objective is designed for the wavelength 193 nm of an ArF excimer laser.

The polarization beamsplitter face P lies diagonally between the surfaces 17 and 18. The beamsplitter face P reflects the light beam coming from the reticle 1 and deflects this beam by 90° to the concave mirror 21. The plane-parallel plate having surfaces 19 and 20 is configured as a λ/4-plate. The λ/4-plate can, for example, be made of dielectric layers, stress-induced birefringent material or optical two-axis material and ensures that the light, which is back reflected from the concave mirror 21, can pass the beamsplitter face P to the exit plane 22 of the beamsplitter.

The system diaphragm A is disposed between the λ/4-plate 19/20 and the concave mirror 21. The system diaphragm A can be placed elsewhere in the space between the exit surface 18 and the concave mirror 21. The numerical aperture can be varied with the aid of the system diaphragm. The correction of the objective shown is so designed that no deterioration occurs as a consequence thereof. No lens is provided between the beamsplitter and the concave mirror 21 and also not as a curved exit surface of the beamsplitter or as a mangin mirror.

The system in the embodiment shown is telecentric at both ends.

An additional λ/4-plate is also possible after the exit surface 22 from the beamsplitter prism as described in European patent publication 0,608,572. Likewise, a corrected phase plate can be seated in the objective or at least one lens surface can be finely aspherically processed to provide the same effect and it need not be rotationally symmetrical.

Referring to Table 2, the sine $R_x$ can, in each case, be the sine of the marginal ray angle after the given group x, but with sine $R_{LG3}$, it is the sine upstream of $R_{LG3}$.

The data in European patent publication 0,608,572 can be computed from the objective data presented therein.

In contrast to the state of the art, the marginal ray angle forward of the deflecting mirror 6 (which also can be omitted) is not reduced; instead, it is slightly increased. The second lens group LG2 then reduces the marginal ray angle which is different from European patent publication 0,608,572, however, is only reduced slightly by approximately 10% compared to the conventional marginal ray angle as shown in U.S. Pat. No. 5,402,267 (wherein this angle is halved).

From the foregoing, it can be seen that the objective of the invention is far afield from a collimation at the entrance into the polarization beamsplitter P.

Viewing sin $R_{LG2}$ and sin $R_{LG3}$ shows however that the divergence angle at the polarization beamsplitter P is advantageously low.

The configuration of the second lens group LG2 is decisive for a good color correction of this objective.

The chromatic magnification difference is approximately 0.2 promille per nanometer wavelength difference. The chromatic magnification difference is therefore advantageously low and compensates approximately for the shift of the centroid because of the color coma, which has the opposite sign. The dominating color error is the Gauss error which is the chromatic variation of spherical aberration. It is possible to compensate for this error by introducing longitudinal chromatic aberrations having an opposite sign.

The Gauss error is a type of defocusing of higher order and therefore has an effect similar to the FLEX method, (for example, as disclosed in the article by H. Fukuda et al in the IEEE Transactions Electron Devices 38 (1991), pages 67 to 75) wherein the image plane is illuminated several times at different defocusings in order to increase the depth of field when utilizing contrast-amplifying resists.

The permissible spectral bandwidth of the excimer laser is therefore dependent upon the process technology of the user. The bandwidth decisively influences the efficiency and light intensity of the excimer laser. The bandwidth is, however, greater than 10 pm.

This value is especially significant because the dispersion of quartz is almost three times greater at 193 nm than at 248 nm.

Figure 2:
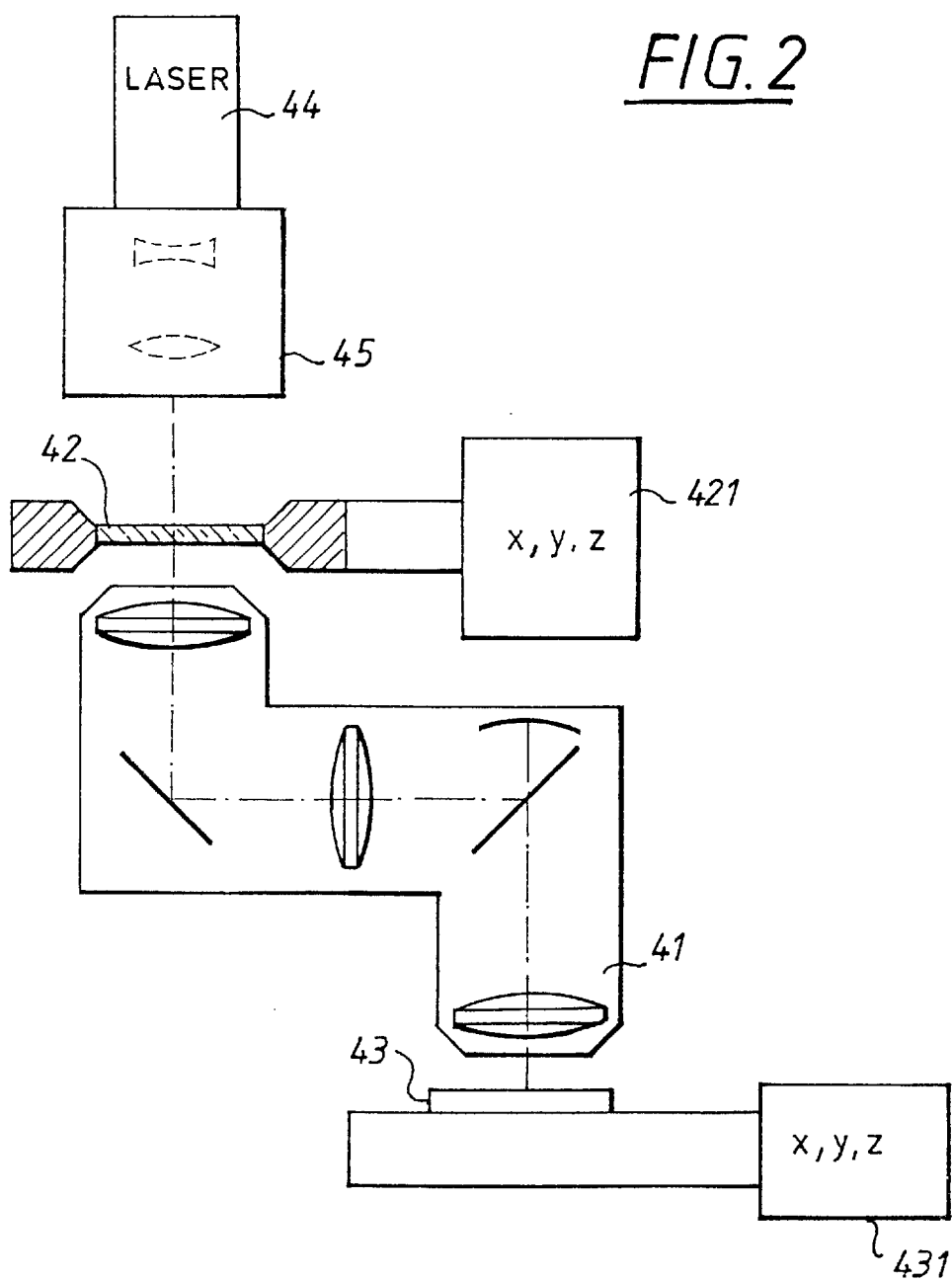

A complete microlithographic projection exposure apparatus is shown in FIG. 2 and includes an excimer laser 44 as a light source, illuminating optic 45, mask 42 (also known as a reticle), a positioning system 421, a projection objective 41 as shown in FIG. 1 and a wafer 43 (to be exposed) on a wafer positioning system 431. Except for the projection objective 41, the parts are configured and coact in accordance with the known state of the art.

The projection objective 41 according to the invention can deviate from the configuration presented in FIG. 1. For example, the imaging scale, numerical aperture, image field, wavelength and bandwidth can be varied as required. An achromatization can also be carried out by utilizing different optical materials. At 193 nm, $CaF_2$ and LiF lasers, for example, can be utilized.

It is understood that the foregoing description is that of the preferred embodiments of the invention and that various changes and modifications may be made thereto without departing from the spirit and scope of the invention as defined in the appended claims.

TABLE 1

The polarization beamsplitter face P is at an angle of 45° to the axis.

| No. | Radius | Thickness | Name of Glass |
|---|---|---|---|
| 1 | ∞ | 111.81 | |
| 2 | 571.30 | 25.84 | Quartz |
| 3 | −220.45 | 17.32 | |
| 4 | −215.16 | 12.41 | Quartz |
| 5 | 762.94 | 114.98 | |
| 6 | ∞ | 100.00 | |
| 7 | 326.54 | 30.46 | Quartz |
| 8 | −15991.4 | 1.08 | |
| 9 | 295.05 | 18.88 | Quartz |
| 10 | 166.26 | 39.75 | |
| 11 | 197.82 | 37.80 | Quartz |
| 12 | 1373.9 | 48.16 | |
| 13 | −407.42 | 23.18 | Quartz |
| 14 | −328.40 | 18.07 | |
| 15 | 420.97 | 13.36 | Quartz |
| 16 | 143.03 | 38.46 | |
| 17 | ∞ | 100.47 | Quartz |
| P | | 87.21 | Quartz |
| 18 | ∞ | 2.04 | |
| 19 | ∞ | 5.10 | Quartz |
| 20 | ∞ | 15.77 | |
| 21 | −365.14 | 15.77 | |
| 20' | ∞ | 5.10 | Quartz |
| 19' | ∞ | 2.04 | |
| 18' | ∞ | 174.42 | Quartz |
| 22 | ∞ | 1.02 | |
| 23 | 219.50 | 16.42 | Quartz |
| 24 | −1096.48 | 0.76 | |
| 25 | 126.12 | 11.66 | Quartz |
| 26 | 165.00 | 0.76 | |
| 27 | 105.25 | 25.65 | Quartz |
| 28 | 85.75 | 4.38 | |
| 29 | 153.52 | 9.69 | Quartz |
| 30 | 3048.63 | .51 | |
| 31 | 177.01 | 7.06 | Quartz |
| 32 | 98.28 | 1.29 | |
| 33 | 112.73 | 14.71 | Quartz |
| 34 | 597.26 | 4.28 | |
| 35 | ∞ | 0.00 | |

TABLE 2

| Example as | Table 1 | US 5,402,226 FIGS. 2,3 | EP 0,608,572 Ex. 1 |
|---|---|---|---|
| sin $R_{Reticle}$ | 0.175 | 0.145 | 0.175 |
| sin $R_{LG1}$ | 0.180 | 0.13 | 0.116 |

TABLE 2-continued

| Example as | Table 1 | US 5,402,226 FIGS. 2,3 | EP 0,608,572 Ex. 1 |
|---|---|---|---|
| sin $R_{LG2}$ | 0.165 | 0.06 | 0.214 |
| sin $R_{LG3}$ | 0.341 | 0.42 | 0.315 |
| $\beta_{21}$ | 0.48 | 0.14 | 0.68 |

What is claimed is:

1. A high-resolution high-apertured objective comprising:

an object plane;

a first lens group, a second lens group downstream of said first lens group;

a beamsplitter downstream of said second lens group;

a concave mirror;

a system diaphragm interposed between said beamsplitter and said concave mirror;

a third lens group arranged downstream of said beamsplitter;

said objective defining an image plane and being configured to provide a reduction scale ($\beta$) in the range of −0.4 to −0.15 and an image side numerical aperture greater than 0.5; and, said first and second lens groups being configured to conjointly reduce the sine of the marginal ray angle.

2. The high-resolution high-apertured objective of claim 1, wherein said system diaphragm is mounted on said concave mirror.

3. The high-resolution high-apertured objective of claim 1, wherein said system diaphragm is mounted on said beamsplitter.

4. The high-resolution high-apertured objective of claim 1, wherein said reduction scale ($\beta$) is −0.25.

5. The high-resolution high-apertured objective of claim 1, wherein said numerical aperture lies in the range of 0.6 to 0.75.

6. A high-resolution high-apertured objective comprising:

an object plane;

a first lens group;

a second lens group downstream of said first lens group;

a beamsplitter downstream of said second lens group;

a concave mirror;

a system diaphragm interposed between said beamsplitter and said concave mirror;

a third lens group arranged downstream of said beamsplitter;

said objective defining an image plane and being configured to provide a reduction scale ($\beta$) in the range of −0.4 to −0.15 and an image side numerical aperture greater than 0.5;

said first and second lens grounds being configured to conjointly reduce the sine of the marginal ray angle; and said first and second lens groups are configured to conjointly reduce the sine of said peripheral ray angle up to 40%.

7. A high-resolution high-apertured objective comprising:

an object plane;

a first lens group;

a second lens group downstream of said first lens group;

a beamsplitter downstream of said second lens group;

a concave mirror;

a system diaphragm interposed between said beamsplitter and said concave mirror;

a third lens group arranged downstream of said beamsplitter;

said objective defining an image plane and being configured to provide a reduction scale (β) in the range of −0.4 to −0.15 and an image side numerical aperture greater than 0.5;

said first and second lens groups being configured to conjointly reduce the sine of the marginal ray angle; and, said second lens group alone is configured to reduce the sine of said marginal ray angle by up to 40%.

8. A high-resolution high-apertured objective comprising:

an object plane;

a first lens group;

a second lens group downstream of said first lens group;

a beamsplitter downstream of said second lens group;

a concave mirror;

a system diaphragm interposed between said beamsplitter and said concave mirror;

a third lens group arranged downstream of said beamsplitter;

said objective defining an image plane and being configured to provide a reduction scale (β) in the range of −0.4 to −0.15 and an image side numerical aperture greater than 0.5;

said first and second lens groups being configured to conjointly reduce the sine of the marginal ray angle; and, the sine of said marginal ray angle (sin $R_{LG1}$) after said first lens groups is not less than the sine of the marginal ray angle (sin $R_{reticle}$) in said object plane.

9. The high-resolution high-apertured objective of claim 1, wherein said beamsplitter and said concave mirror conjointly define a space free of lenses.

10. The high-resolution high-apertured objective of claim 1, wherein said first lens group and said second lens group conjointly include a plurality of lenses not exceeding seven in number.

11. A microlithographic projection apparatus defining an optical axis, the apparatus comprising:

a light source for generating and transmitting light along said optical axis; and, a high-resolution objective including: an object plane; a first lens group; a second lens group downstream of said first lens group; a beamsplitter downstream of said second lens group; a concave mirror; a system diaphragm interposed between said beamsplitter and said concave mirror; a third lens group arranged downstream of said beamsplitter for receiving the light back reflected at said concave mirror; said objective defining an image plane and being configured to provide a reduction scale (β) in the range of −0.4 to −0.15 and an image side numerical aperture greater than 0.5; and, said first and second lens groups being configured to conjointly reduce the sine of the marginal ray angle.

12. The microlithographic projection apparatus of claim 11, wherein said light source is an excimer laser generating light in the deep ultraviolet range.

13. The high-resolution high-apertured objective of claim 1, wherein light coming from said second lens group is reflected by said beamsplitter towards said concave mirror.

14. The high-resolution high-apertured objective of claim 1, wherein said second lens group is a collecting lens group which operates to reduce said marginal ray angle.

\* \* \* \* \*

UNITED STATES PATENT AND TRADEMARK OFFICE
CERTIFICATE OF CORRECTION

PATENT NO. : 5,880,891
DATED : May 9, 1999
INVENTOR(S) : Gert Fuerter

It is certified that error appears in the above-identified patent and that said Letters Patent is hereby corrected as shown below:

In column 3, line 27: delete "where" and substitute -- wherein: -- therefor.

In column 3, line 53: delete "$A_6 0.267922 \ 10^{-13}$" and substitute -- $A_6 = 0.267922 \cdot 10^{-13}$ -- therefor.

In column 6, line 13: delete "group," and substitute -- group; -- therefor.

In column 6, line 55: delete "grounds" and substitute -- groups -- therefor.

In column 6, line 57: delete "and" and substitute -- and, -- therefor.

In column 7, line 35: delete "groups" and substitute -- group -- therefor.

Signed and Sealed this

First Day of May, 2001

Attest:

NICHOLAS P. GODICI

*Attesting Officer*     *Acting Director of the United States Patent and Trademark Office*